United States Patent [19]

Edwards

[11] Patent Number: 5,126,659
[45] Date of Patent: Jun. 30, 1992

[54] ENABLEMENT OF A TEST MODE IN AN ELECTRONIC MODULE WITH LIMITED PIN-OUTS

[75] Inventor: Arthur J. Edwards, Hoffman Estates, Ill.

[73] Assignee: Motorola, Inc., Schaumburg, Ill.

[21] Appl. No.: 553,469

[22] Filed: Jul. 13, 1990

[51] Int. Cl.⁵ .......................................... G01R 31/28
[52] U.S. Cl. .............................. 324/158 R; 324/73.1; 324/158 T
[58] Field of Search .............. 324/158 R, 158 T, 73.1; 371/22.1, 22.2, 21.1; 361/93, 95

[56] References Cited

U.S. PATENT DOCUMENTS

| | | | |
|---|---|---|---|
| 3,978,374 | 8/1976 | Rohr | 361/95 |
| 4,039,932 | 8/1977 | Duckworth | 340/664 |
| 4,246,622 | 1/1981 | Hosoda et al. | 361/95 |
| 4,336,495 | 6/1982 | Hapke | 324/158 R |
| 4,398,146 | 8/1983 | Draheim et al. | 324/158 R |
| 4,450,402 | 5/1984 | Owen, III | 324/72.5 |
| 4,562,550 | 12/1985 | Beatty | 364/483 |
| 4,691,161 | 9/1987 | Kant et al. | 324/73.1 |
| 4,752,729 | 6/1988 | Jackson et al. | 371/22.1 |
| 4,809,125 | 2/1989 | Matsko et al. | 361/93 |
| 4,912,709 | 3/1990 | Teske et al. | 371/22.1 |

Primary Examiner—Kenneth A. Wieder
Assistant Examiner—B. Burns
Attorney, Agent, or Firm—John H. Moore

[57] ABSTRACT

A method for establishing a test mode in an electronic module (10) having an internal fault detector (26) that limits the current in an output transistor (Q1) when an abnormal signal level appears at an output pin (16). An abnormal signal level is intentionally established on the output pin to enable the fault detector, and such enablement is sensed to trigger the test mode within the module. Apparatus for implementing this method in a voltage regulator is also disclosed.

9 Claims, 1 Drawing Sheet

ENABLEMENT OF A TEST MODE IN AN ELECTRONIC MODULE WITH LIMITED PIN-OUTS

FIELD OF THE INVENTION

This invention is directed to a technique and apparatus for selectively putting an IC (integrated circuit), or another type of electronic module, into a test mode in which one or more functions of the IC or module can be tested for proper operation. A single-chip voltage regulator is an example of an IC to which this invention is particularly well suited.

BACKGROUND OF THE INVENTION

Herein, the term "electronic module" means an IC or other form of packaged electronic circuitry having a limited number of input/output pins.

It is often required that an electronic module be able to enter a test mode, in which one or more functional characteristics of the module are tested and/or modified. This can be done by including a separate pin which receives a signal for initiating the test mode. But where a pin cannot be dedicated solely to the testing function (particularly in IC's) the test mode has been conventionally initiated by applying to a pin, which pin is also used for a function other than testing, a voltage which is outside its normal operating range (typically above $V_{cc}$ or below ground). That voltage is detected in the module and used to trigger the test mode.

Although the last-mentioned technique can be used in certain applications, some IC's have such a small number of input/output pins, and/or operate in such a critical environment, that this conventional technique cannot always be used reliably. For example, an automotive voltage regulator that is constructed as an IC may have only three input/output pins that are available for normal operation of the device and for use in initiating the test mode. Moreover, the environment in which the voltage regulator is used in sometimes too noisy to reliably use an abnormally high or low voltage on one of the pins to initiate the test mode.

OBJECTS OF THE INVENTION

It is a general object of the invention to provide an improved method and apparatus for overcoming the above-noted deficiencies associated with initiating test modes in electronics modules.

It is another object of the invention to provide improved circuitry for an IC that permits initiation of a test mode, and further, to provide an improved voltage regulator that can be reliably set into a test mode in a noisy environment without the use of extra input/output pins.

DESCRIPTION OF THE PREFERRED EMBODIMENT

Figure 1:
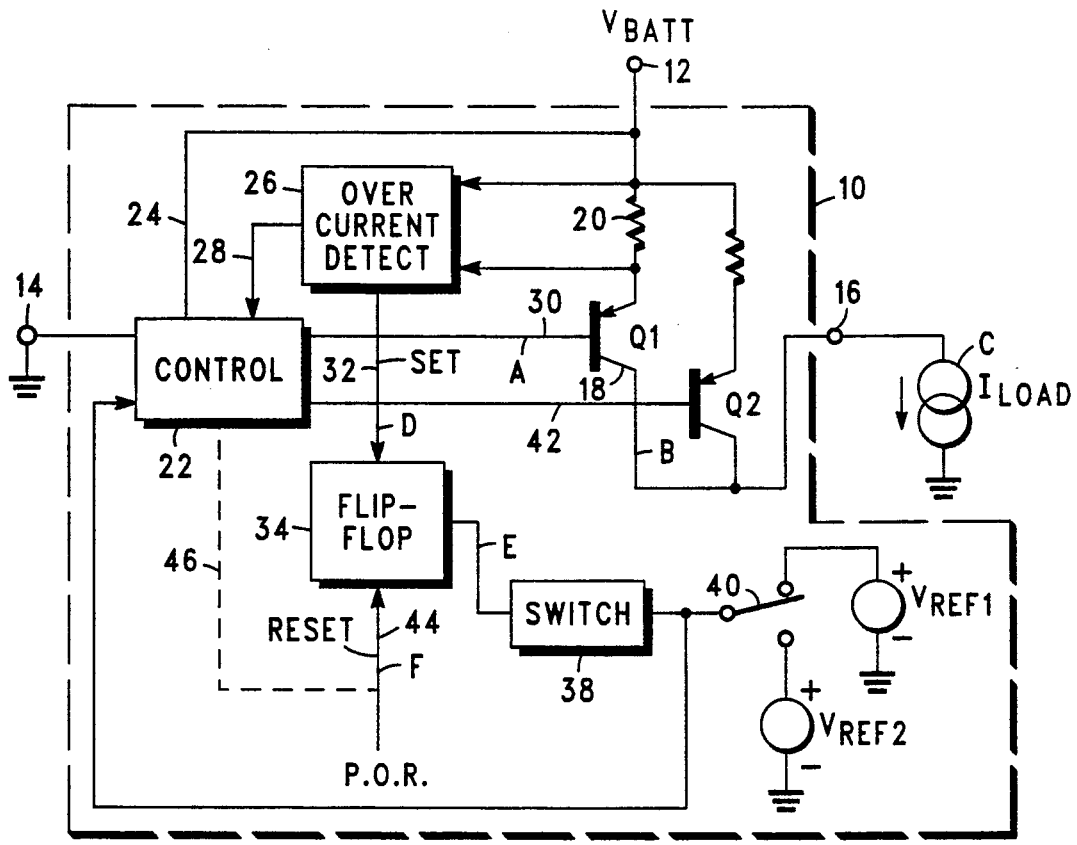
FIG. 1 is a schematic diagram of an electronic module (shown as a voltage regulator IC) incorporating the invention.

Referring to FIG. 1, a form of electronic module is shown which incorporates various aspects of the invention to provide on improved voltage regulator IC 10 whose boundary is shown by the dashed line. Various aspects of the invention are applicable to other forms of electronic modules.

The illustrated embodiment has only three input/output pins: a first pin 12 that receives battery voltage $V_{batt}$ from the battery of a vehicle that uses the IC regulator 10; a second pin 14 that receives a reference potential (such as ground) for use by the circuitry within the IC regulator 10; and a third pin 16 which carries output current to a load which, in the case of this particular embodiment, is the field winding of an alternator (not shown).

Inside the IC 10, an output transistor Q1 has an output terminal 18 coupled to the output pin 16. The emitter of Q1 is coupled through a resistor 20 to the battery terminal 12. With this conventional arrangement, the transistor Q1 supplies load current to the alternator via the output pin 16.

Also included in the IC 10 is a conventional control circuit 22 that, in the normal (non-test) mode of operation, senses the value of an internal voltage source $V_{refl}$, senses the value of the battery voltage via a lead 24, and controls the level of current in the transistor Q1 based on the difference in the values of the sensed voltages.

To protect the transistor Q1, a conventional fault detector, shown here as an over-current detector 26, is included. The purpose of this device is to sense the level of current in the transistor Q1, and to at least reduce that current level when a threshold level of current has been exceeded. The detector 26 may accomplish this by sensing the voltage drop across the resistor 20 and, when the sensed voltage is too high, sending a signal to the control circuit 22 via a lead 28. The control circuit 22 may respond to the received signal by either reducing the level of current in the transistor Q1 to a relatively low level, or by shutting off the transistor Q1 entirely. Alternately, the detector 26 may include a direct connection back to the transistor Q1 to shut it down, thereby overriding the control normally executed by the control circuit 22. In either case, the detector 26 senses when the transistor Q1 conducts an abnormally high level of current and causes (either directly or indirectly) the level of current in Q1 to be at least reduced, and possibly shut off completely.

In order to initiate a test mode in the IC, an abnormal signal level is established at the output pin 16 so as to enable (trigger) the detector 26. The enablement of the detector 26 is sensed and that is used to initiate the test mode.

Figure 2:
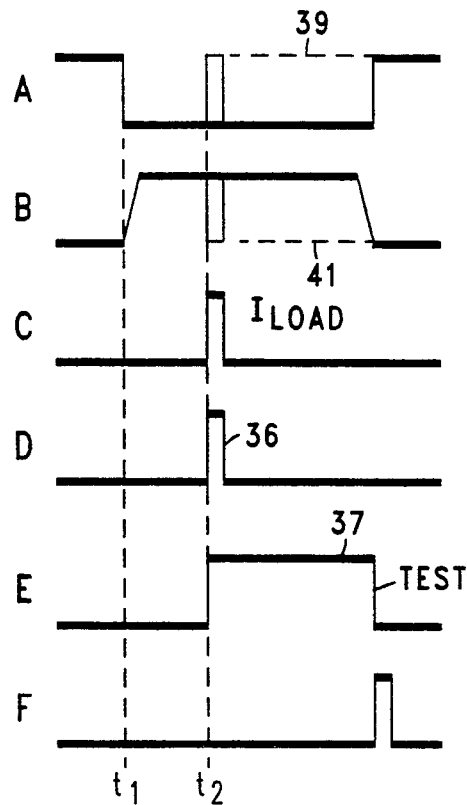
FIG. 2 shows various waveforms that are developed or used by the circuitry shown in FIG. 1.

In the illustrated embodiment, an abnormal signal level is established at the output pin 16, preferably be inducing an abnormally high current pulse therein. This may be accomplished by removing the normal load from the pin 16 and switching in a low impedance test load which will cause the current through Q1 to exceed the detect threshold of the detector 26. Waveform C of FIG. 2 illustrates such an abnormal current pulse. (The waveforms A-F in FIG. 2 appear on leads in FIG. 1 which carry the same letter designation.)

The detector 26 responds by signaling the control circuit 22, via lead 28, that an abnormally high current condition has been detected. This causes the control circuit 22 to change the base drive to the transistor Q1 via a lead 30. As shown by waveform A of FIG. 2, the voltage applied to the base of Q1 by the control circuit 22 previously dropped to a low voltage at time t1 to start a normal cycle of operation. This resulted in the voltage at the output terminal 18 of Q1 rising, as shown by waveform B. Thus, between times t1 and t2, the IC 10 operates normally; i.e., in a non-test mode.

At time t2, the current pulse shown in waveform C occurs and the output voltage from the control 22 (waveform A) goes high to turn off the transistor Q1 (alternate embodiments may merely reduce the level of current in Q1 to a low, safe value). This drives the voltage at terminal 18 low at time t2 (waveform B).

The detector 26 has another output lead 32 which carries a pulse 36 (waveform D) to a flip-flop 34. The illustrated pulse 36 is generated when the detector 26 senses the abnormally high current level in the transistor Q1.

The flip-flop 34 can develop an output signal that has one of two states, high and low. When triggered by the pulse 36, the flip-flop 34 generates a high output state which constitutes a test-mode signal 37. See waveform E in FIG. 2. The existence of this signal 37 indicates that a test mode is now being initiated in the IC 10.

As shown, the test mode signal 37 is coupled to a switch 38 that moves a switch contact 40 from the present illustrated position where it couples $V_{ref1}$ to the control 22 to the other illustrated position where it couples $V_{ref2}$ to the control 22. Thus, in the test mode, a new reference voltage source is coupled to one of the inputs of the control circuit 22 so that the value of that reference voltage maybe compared to the battery voltage received via the terminal 12 and lead 24.

Assuming that the level of current in the transistor Q1 was merely reduced and not shut down completely when the over current detector 26 was enabled, the control circuit 22 will now output a signal to the base of the transistor Q1 so that its output current, which is indicative of the test results, may now be monitored at the output terminal 16, thereby to sense the results of the test.

In this embodiment, the testing involves substituting the reference voltage source $V_{ref2}$ in place of the reference voltage source $V_{ref1}$ as an example of how the invention might be used to implement a test. While $V_{ref1}$ would be the normal reference voltage against which the battery voltage would be compared by the control circuit 22, and the $V_{ref1}$ would typically have a temperature coefficient of minus 10 millivolts per degree centigrade at 14 volts, $V_{ref2}$ would preferably have a temperature coefficient of zero degrees millivolts per degree centigrade so that the comparison between the battery voltage and the reference voltage $V_{ref2}$ can be conducted, irrespective of the temperature of the IC 10. Of course, other and/or different tests may be conducted in response to the test mode signal, such as by changing the frequency of the operation of the IC 10. Of course, when the electronic module is not a voltage regulator, a different type of test can be conducted that is specific to the needs of the particular electronic module. The test illustrated in connection with FIG. 1 is merely exemplary of one of many such tests which may be conducted.

As mentioned previously, the transistor Q1 outputs a low level current (during the test mode) that is modulated or controlled by the control circuit 22 to indicate, at the output pin 16, the results of the test. However, it is also contemplated that the transistor Q1 may be completely shut down and latched off in response to the detection of a abnormally high level of current. This alternate mode of operation is shown in FIG. 2 by the dashed lines 39 and 41 (waveforms A and B) which indicate that waveform A may be latched high at the beginning of the test mode, thereby latching waveform B low and holding the transistor Q1 completely off. In this situation, another transistor Q2 is preferably included.

The transistor Q2 constitutes a second output transistor which is coupled to the output pin 16 in parallel with the other output transistor Q1. Typically, the transistor Q2 will be capable of conducting only a small fraction of the current that the transistor Q1 is capable of conducting, and the transistor Q2 will not be shut off when the detector 26 detects that the transistor Q1 is conducting an abnormally high level of current. In fact, the transistor Q2 is held in an on condition specifically for the purpose of supplying a low level output current to the output pin 16 under the control of control circuitry 22 during the test mode operation. Note that the base drive of the transistor Q2 is received from the control circuit 22 via a separate lead 42 which does not carry a shut-down signal in response to over-current detection. The lead 42 merely carries test mode information from the control circuit 22 so that a signal is available at output pin 16 to represent the test results while the transistor Q1 is completely shut down.

Referring again to the flip-flop 34, it has an input lead 44 that receives a reset signal in order to periodically insure that the output of the flip-flop 34 is in the normal, i.e. non-test mode, state. Such a reset signal can be derived from a conventional POR (power on reset) signal as is conventionally available in IC's, or it can alternately be received from the control circuit 22 via a lead shown as a dashed line 46.

It can be seen, therefore, that the illustrated embodiment provides an electronic module with the capability of using some circuitry which is conventionally included within an electronic module in a manner so as to easily and economically implement a test mode operation without increasing the number of input/output pins that are required. Furthermore, the preferred method of inducing the test mode operation, i.e., inducing an abnormally high level of current at the output pin 16, makes this test mode technique useable in high noise environments in which merely raising or lowering the voltage at one of the input/output pins beyond its normal range would not be a reliable indication that the test mode should be initiated.

Although the invention has been described in the terms of a preferred embodiment it will be obvious to those skilled in the art that many alterations and modifications may be made without departing from the invention. Accordingly it is intended that all such alterations and modifications be considered as within the spirit and scope of the invention as defined by the appended claims.

What is claimed is:

1. An electronic module capable of being selectively put into a test mode, comprising:
   an output transistor having an output terminal;
   a signal output pin coupled to the output terminal;
   fault detection circuitry sensing the operation of the output transistor for causing the level of current in the output transistor to be at least reduced when the output transistor experiences an abnormal signal level;
   means responsive to the fault detection circuitry causing the level of current in the output transistor to be reduced for developing a test-mode signal; and
   means responsive to the test mode signal for initiating a functional test of the module, whereby the module can be put into the test mode by intentionally establishing a condition at the output terminal that causes the output transistor to experience an abnormal signal level.

2. An electronic module as set forth in claim 4 wherein the means for developing the test mode signal includes a flip-flop for developing a two-state output signal, one of said signal states being the test-mode signal.

3. A voltage regulator capable of being selectively put into a test mode, comprising:
   an output transistor having an output terminal;
   a signal output pin coupled to the output terminal;
   fault detection circuitry sensing the operation of the output transistor for causing the level of current in the output transistor to be at least reduced when the output transistor experiences an abnormal signal level;
   means responsive to the fault detection circuitry causing the level of current in the output transistor to be reduced for developing a test-mode signal;
   a first reference voltage source;
   a control circuit sensing the first reference voltage source and controlling the current flow in the output transistor; and
   means responsive to the test-mode signal for initiating a functional test of the voltage regulator, including a second reference voltage source and switch means responsive to the test-mode signal for causing the control circuit to sense the second reference voltage source rather than the first reference voltage source.

4. An electronic module capable of being selectively put into a test mode, comprising:
   an output transistor having an output terminal;
   a signal output pin coupled to the output terminal
   fault detection circuitry sensing the operation of the output transistor and responsive to abnormally high levels of current in the output transistor for causing the level of current in the output transistor to be at least reduced when the output transistor experience an abnormal signal level;
   means responsive to the fault detection circuitry causing the level of current in the output transistor to be reduced for developing a test-mode signal; and
   means responsive to the test mode signal for initiating a functional test of the module, whereby the test mode is initiated by intentionally establishing an abnormally high level of current at the output pin.

5. An electronic module as set forth in claim 4 wherein the fault detector causes the output transistor to be turned off responsive to sensing an abnormally high level of current therein, and further including a second output transistor coupled to the output pin in parallel with the other output transistor, and wherein the second output transistor is not turned off by the fault detector, whereby the second output transistor remains capable of supplying current to the output pin while the module is in the test mode.

6. An IC capable of being selectively put into a test mode, wherein the IC has only three input/output pins, one pin for receiving input power, another pin for receiving a reference potential, and the third pin for delivering output current to a load, the IC comprising:
   an output transistor coupled to the output pin for delivering output current thereto;
   a fault detector sensing the level of current in the output transistor for causing the level of current in the output transistor to be at least reduced when an abnormally high level of current is sensed;
   a bi-stable circuit for generating a test-mode signal responsive to the fault detector causing the level of current in the output transistor to be reduced;
   means responsive to the test mode signal for initiating a functional test of the IC; and
   means for resetting the IC to terminate the test mode signal.

7. An IC as set forth in claim 6 wherein the IC is a voltage regulator, and wherein the current from the output pin may be used to supply current to the field winding of an alternator.

8. An IC as set forth in claim 6 wherein the fault detector causes the output transistor to be turned off responsive to sensing an abnormally high level of current therein, and further including a second output transistor coupled to the third input/output pin, and wherein the second output transistor remains on when the other output transistor is turned off by the fault detector.

9. A single-chip automotive voltage regulator IC having only three input/output pins, one of the pins being adapted to receive battery voltage, another of the pins being adapted to receive a reference potential, and the third pin being an output pin adapted to deliver an output current to an alternator, the regulator comprising:
   an output transistor coupled to the output pin for delivering the output current thereto;
   an over-current detector sensing the level of current in the output transistor and developing an output signal upon sensing that the level of current exceeds a selected threshold;
   control circuitry coupled to the over-current detector and to the output transistor for at least reducing the level of current in the output transistor responsive to the over-current detector sensing a level of current that exceeds the threshold; and
   circuitry responsive to said output signal for generating a test-mode signal; and
   test circuitry responsive to the test mode signal for initiating a preselected functional test of the voltage regulator.

* * * * *